United States Patent
Ramanathan et al.

(10) Patent No.: US 9,515,256 B2
(45) Date of Patent: Dec. 6, 2016

(54) PHASE TRANSITION DEVICES AND SMART CAPACITIVE DEVICES

(71) Applicants: Shriram Ramanathan, Acton, MA (US); Dmitry Ruzmetov, Cambridge, MA (US); Venkatesh Narayanamurti, Boston, MA (US); Changhyun Ko, Cambridge, MA (US)

(72) Inventors: Shriram Ramanathan, Acton, MA (US); Dmitry Ruzmetov, Cambridge, MA (US); Venkatesh Narayanamurti, Boston, MA (US); Changhyun Ko, Cambridge, MA (US)

(73) Assignee: PRESIDENTS AND FELLOWS OF HARVARD COLLEGE, Cambridge, MA (US)

(*) Notice: Subject to any disclaimer, the term of this patent is extended or adjusted under 35 U.S.C. 154(b) by 8 days.

(21) Appl. No.: 14/816,208

(22) Filed: Aug. 3, 2015

(65) Prior Publication Data

US 2015/0340607 A1    Nov. 26, 2015

Related U.S. Application Data

(63) Continuation of application No. 13/056,982, filed as application No. PCT/US2009/052521 on Aug. 2, 2009, now abandoned.

(60) Provisional application No. 61/085,656, filed on Aug. 1, 2008.

(51) Int. Cl.
   *H01L 45/00*   (2006.01)
   *G11C 11/16*   (2006.01)
   (Continued)

(52) U.S. Cl.
   CPC ........... *H01L 45/1206* (2013.01); *G11C 11/16* (2013.01); *G11C 13/0007* (2013.01); *H01L 27/2463* (2013.01); *H01L 29/66984* (2013.01); *H01L 45/06* (2013.01); *H01L 45/12* (2013.01); *H01L 45/1226* (2013.01); *H01L 45/1233* (2013.01); *H01L 45/1253* (2013.01); *H01L 45/146* (2013.01); *H01L 45/147* (2013.01); *H01L 45/1616* (2013.01); *H01L 45/1625* (2013.01); *H01L 45/1675* (2013.01); *H01L 49/003* (2013.01); *G11C 2213/32* (2013.01);
   (Continued)

(58) Field of Classification Search
   CPC ................... H01L 21/0231; H01L 21/76825; H01L 45/145; H01L 45/146; H01L 45/147; H01L 45/1658; H01L 45/1641
   See application file for complete search history.

(56) References Cited

U.S. PATENT DOCUMENTS

| 3,648,124 A * | 3/1972 | Howard, Jr. ............ H01L 29/00 257/1 |
| 6,624,463 B2 * | 9/2003 | Kim ...................... H01L 49/003 257/192 |

(Continued)

*Primary Examiner* — Jerome Jackson, Jr.
(74) *Attorney, Agent, or Firm* — Elizabeth Kim Patent Law Offices LLC

(57) ABSTRACT

Phase transition devices may include a functional layer made of functional material that can undergo a change in conductance in response to an external stimulus such as an electric or magnetic or optical field, or heat. The functional material transitions between a conducting state and a non-conducting state, upon application of the external stimulus. A capacitive device may include a functional layer between a top electrode and a bottom electrode, and a dielectric layer between the functional layer and the top electrode. A three terminal phase transition switch may include a functional layer, for example a conductive oxide channel, deposited between a source and a drain, and a gate dielectric layer and a gate electrode deposited on the functional layer. An array of phase transition switches and/or capacitive devices may be formed on a substrate, which may be made of inexpensive flexible material.

19 Claims, 9 Drawing Sheets

(51) Int. Cl.
  *G11C 13/00* (2006.01)
  *H01L 27/24* (2006.01)
  *H01L 29/66* (2006.01)
  *H01L 49/00* (2006.01)
  *H01L 49/02* (2006.01)

(52) U.S. Cl.
  CPC ....... *G11C 2213/34* (2013.01); *G11C 2213/53* (2013.01); *H01L 28/20* (2013.01); *H01L 28/40* (2013.01)

(56) References Cited

U.S. PATENT DOCUMENTS

| | | | | |
|---|---|---|---|---|
| 6,890,768 B2* | 5/2005 | Karaswaw | ............ | H01L 28/56 257/E21.01 |
| 7,771,513 B2* | 8/2010 | Kim | ............ | B01D 53/04 95/138 |
| 2004/0235204 A1* | 11/2004 | Kozicki | ............ | H01L 45/141 438/9 |
| 2007/0069193 A1* | 3/2007 | Yoon | ............ | H01L 49/003 257/8 |

* cited by examiner

PHASE TRANSITION DEVICES AND SMART CAPACITIVE DEVICES

CROSS-REFERENCE TO RELATED APPLICATIONS

This application is a continuation of application Ser. No. 13/056,982, entitled "Phase Transition Devices and Smart Capacitive Devices," which is the National Stage of International Application No. PCT/US2009/052521, filed Aug. 2, 2009, and claims the benefit of priority under 35 U.S.C. §119(e) from U.S. Provisional Application No. 61/085,656, filed on Aug. 1, 2008, entitled "Phase Transition Devices and Smart Capacitive Devices." The foregoing applications are incorporated herein by reference in their entireties.

STATEMENT REGARDING FEDERALLY SPONSORED RESEARCH

This invention was made with Government support under National Science Foundation award PHY-0601184. The Government has certain rights in the invention.

BACKGROUND

A phase transition refers to a transformation of a system from one phase to another. Examples of phase transitions include conductance transitions, as well as transitions between solid, liquid and gaseous states of matter.

Conductance transitions involve transitions between different conductance states. For example, metal-insulator transitions refer to transitions between a metallic (or conducting) state and an insulating (or non-conducting) state. Conductance transitions may be induced by external stimuli such as temperature, electric field, magnetic field, photons and rapid fluctuations in the local environment.

Recently, much research effort has been devoted to materials that are capable of undergoing very fast phase transitions (for example, metal-insulator transitions) under certain conditions. There are many potential applications for such materials.

BRIEF DESCRIPTION OF THE DRAWINGS

The drawings disclose illustrative embodiments. They do not set forth all embodiments. Other embodiments may be used in addition or instead.

DESCRIPTION

Figure 1:
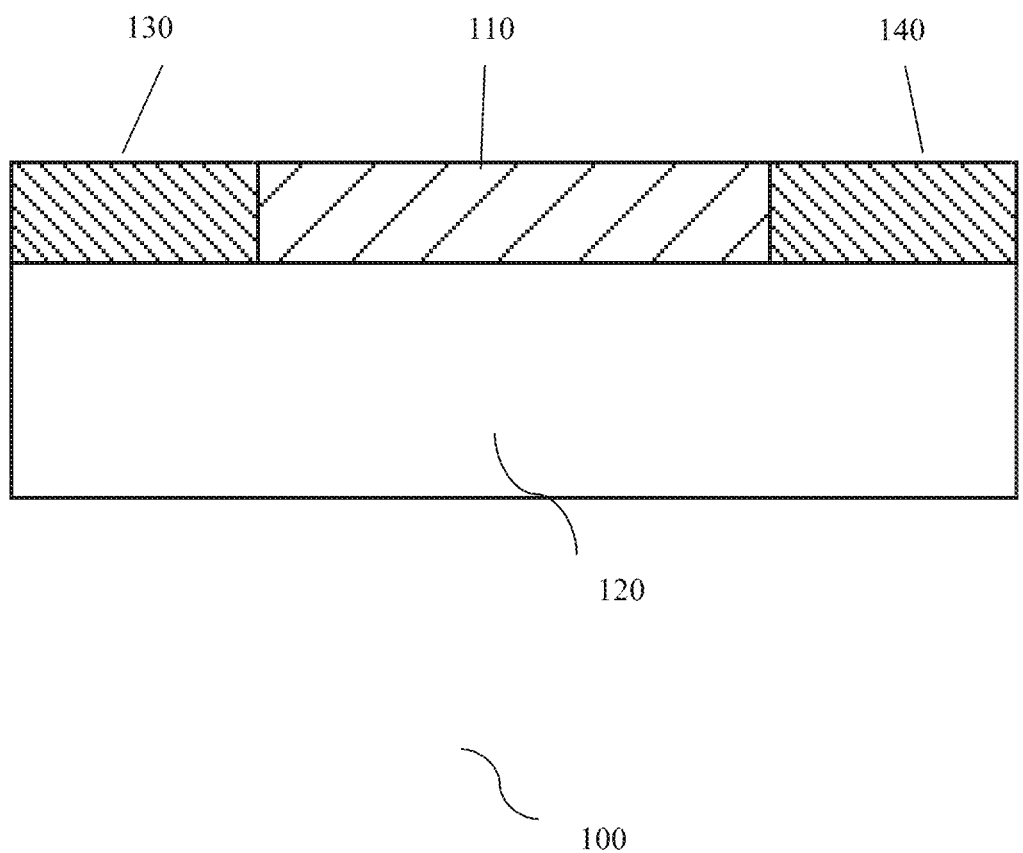
FIG. 1 is a schematic diagram of a two terminal device in accordance with an embodiment of the present disclosure, including a layer of functional material directly deposited on a substrate.

Illustrative embodiments are now discussed. Other embodiments may be used in addition or instead.

In the present disclosure, methods and systems are described that utilize materials that can undergo very fast phase transitions. These phase transitions include, without limitation, conductance transitions such as metal-insulator transitions. Such materials can be utilized in a number of applications, including but not limited to computers, solid state devices, and circuits.

In the present disclosure, the term "smart material" refers to a material that undergoes a change in electrical resistance or conductance when one or more external stimuli are applied to the material. In the present disclosure, the terms "functional material" and "phase transition material" have the same meaning as the term "smart material" and are used interchangeably. The term "smart connection" refers to a connector that interconnects two or more components of a device or circuit, and that is made at least in part from a smart material. The term "smart layer" refers to a layer made of smart material. The term "functional layer" refers to a layer made of functional material. The term "phase transition device" refers to a device that includes at least one layer of a phase transition material.

Conductance transitions can be induced in any one of the above-listed materials when one or more external stimuli are applied to that material. Examples of such external stimuli include, but are not limited to: heat (i.e. change in temperature); an electric field; a magnetic field; photons of light (for example, visible light or UV light); and rapid fluctuations in the local environment.

Examples of smart materials that can undergo such conductance transitions include without limitation: vanadium oxides such as $VO_2$, titanates such as $BaTiO_3$, and doped $BaTiO_3$ where the dopants may be one or more of: La, Ca, and Sr.

In one or more embodiments of the present disclosure, these smart (or functional) materials are fabricated in thin film form on a substrate. The substrate may be made of materials that include without limitation Si, $SiO_2$, $Al_2O_3$, AlN, MgO, Ge, and InAs.

Due to the presence of multiple oxidation states, synthesis of high-quality $VO_2$ films on substrates with the desired phase transition characteristics such as large jumps in phase transition resistance is a challenge.

Electrical measurements of the MIT can be used as a main characterization criterion for film quality, which is relevant to the objective of utilizing the MIT in $VO_2$ in fast switching electronic and electro-optic devices. Potential applications of ultrafast phase transitions include highly scaled logic and memory devices and optical modulators.

Thin films typically show less impressive electrical properties compared to single crystals partly due to the difficulty of synthesis of phase pure VO2 arising from existence of multiple valence states of V. Synthesis of phase pure $VO_2$ as well as the ability to controllably tune the stoichiometry is critical for further development of $VO_2$ as well as to recover the original properties of the material following multiple switching cycles. Further, enabling low temperature processing of $VO_2$ can enable heterogeneous integration of electro-optic modulators on silicon-based electronics that is of great importance for sensor technologies.

As described in the '656 provisional application, the resistance ratio across the metal-insulator transition as well as the resistance of thin film $VO_2$ may be modulated at relatively low temperatures by the use of ultra-violet (UV) irradiation. The enhanced oxygen incorporation due to creation of excited oxygen species may enable controllably tunable stoichiometry.

Post-deposition treatment of vanadium oxide with ultra-violet (UV) radiation at relatively low temperatures (<250° C.) can significantly alter the electrical resistance properties by controllably tuning the stoichiometry. UV photons can be employed to induce a significant change in oxygen incorporation in comparison with natural oxidation by creation of highly reactive atomic oxygen and ozone.

FIGS. 1-9 disclose examples of devices that can be fabricated using the above-described materials. As explained below, these devices may include, without limitation: two-terminal devices, three-terminal devices, tunnel junctions, smart capacitors, and multi-functional three-dimensional circuits that incorporate smart connections.

FIG. 1 is a schematic diagram of a two-terminal device 100 in accordance with an embodiment of the present disclosure. The device 100 includes a functional layer 110, which is formed of a functional material. In the illustrated embodiment, the functional layer 110 is directly deposited on a substrate 120, in between two electric contacts 130 and 140.

The functional material forming the layer 110 may be any one of the materials described in the above paragraphs, or any other material capable of undergoing similar phase transitions.

The functional layer 110 can be grown on the substrate 120 using thin film deposition techniques, followed by lithography and polishing to generate a conformal surface. Additional circuits or devices can be fabricated on top of these layers.

In some embodiments, the contacts 130 and 140 may be made of metal, for example Cu. In other embodiments, the contacts may be made of a magnetic material, such as Ni, Fe, NiFe, and Heusler alloys by way of example. In some embodiments, the contacts may be ferromagnets. The ferromagnets may have a high degree of spin polarization. In such embodiments, spin polarized electron injection into the two terminal device may be possible, generating a class of devices that can undergo phase transitions sensitive to spin.

Alternatively, the contacts may be made of oxide conductors, including without limitation $IrO_2$. Alternatively, the contacts may be made of magnetic oxides, including without limitation $CrO_2$.

In some embodiments, the substrate 120 may be made of a semiconductor material. Examples of semiconductor material forming the substrate include, without limitation: single crystal silicon; polycrystal silicon; InAs; Ge; InP; ZnO; group III-V semiconductors; group II-VI semiconductors; group IV semiconductors; and organic semiconductors such as pentacene, anthracene, and polymers. In other embodiments, the substrate 120 can be made of inexpensive flexible material, such as polysilicon, plastic, or polymer.

Figure 2:
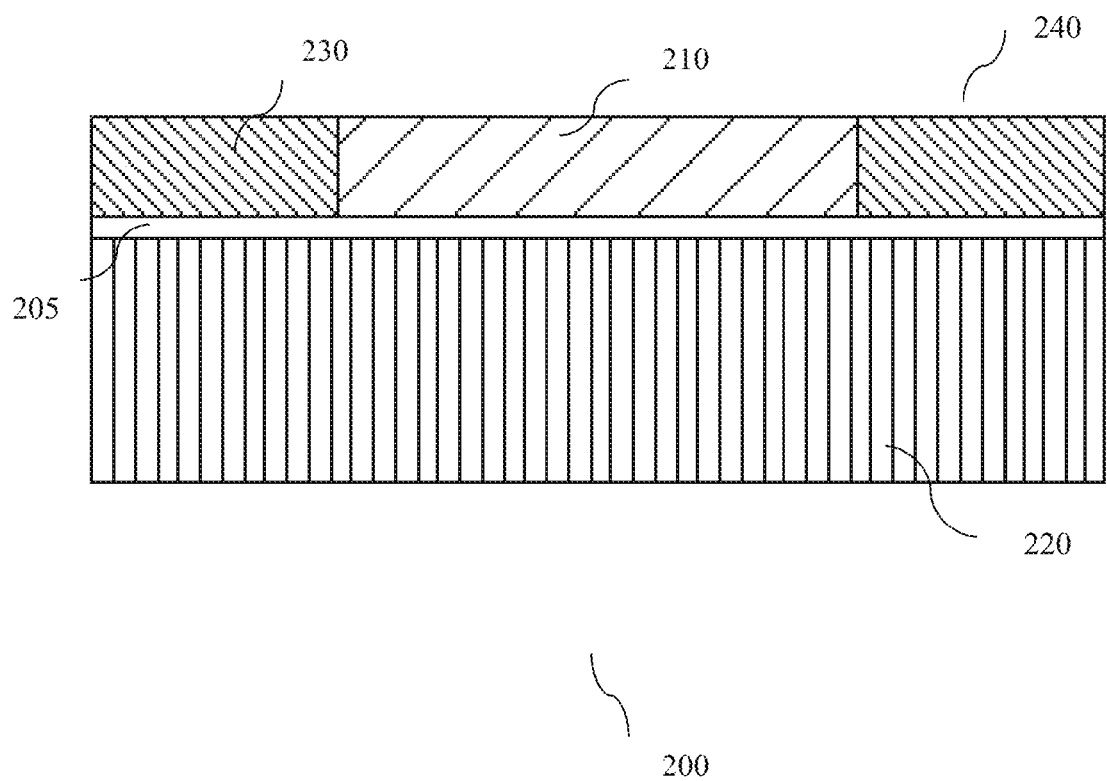
FIG. 2 is a schematic diagram of another two terminal device in accordance with an embodiment of the present disclosure, the device further including an insulating layer between the layer of functional material and the substrate.

FIG. 2 is a schematic diagram of a two terminal device 200 in accordance with another embodiment of the present disclosure. In the illustrated embodiment, a layer 210 of functional material and contacts 230 and 240 are fabricated on an insulating layer 205, which in turn is deposited on a substrate 220. In this case, since the bottom substrate 220 is isolated from the layer 210 by the insulating layer 205, the substrate 220 can be used as a gate if necessary.

The insulation layer 205 can be made of a number of insulation materials, including without limitation silicon nitrate, silicon dioxide, aluminum oxide, and high-k dielectrics such as hafnium silicate, zirconium silicate, hafnium dioxide and zirconium dioxide, by way of example. The insulating layer 205 can be deposited on the substrate using thin film deposition techniques.

Figure 3:
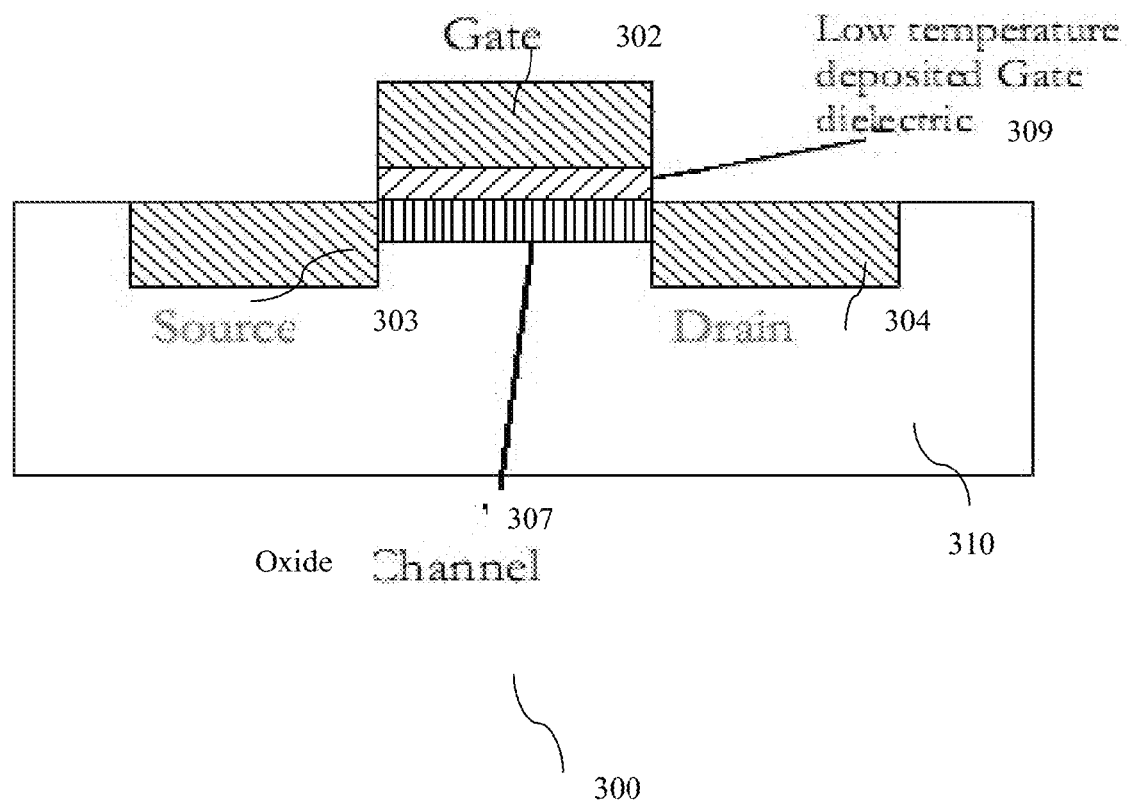
FIG. 3 is a schematic diagram of a three terminal device in accordance with an embodiment of the present disclosure, the device including an oxide conducting channel whose conductance can be modulated to control the current flowing across the device, so that the device functions as a phase transition switch.

FIG. 3 illustrates a three-terminal device 300 that can function as a phase transition switch. In the illustrated embodiment, the three-terminal device 300 includes a gate 302, a source 303, and a drain 304. The source 303 and the drain 304 are disposed on a substrate 310. An oxide conduction channel 307 is deposited on the substrate 310 between the source 310 and the drain 304. A layer 309 of low temperature deposited gate dielectric material is deposited on the oxide channel 307. The gate 302 is disposed over the gate dielectric layer 309.

In some embodiments, the oxide conduction channel 307 is made of a functional oxide, examples of which include, without limitation, $CaVO_2$, $BaTiO_3$, and doped vanadium oxide.

In some embodiments, the conductance of the oxide channel 307 can modulate the current flowing across the device 300, thereby allow the device 300 to function as a switch. When a gate voltage is applied to the gate 302, the functional oxide material in the oxide conduction channel 307 can change its conductance from insulating to conducting, thus changing its ability to transmit light. In other words, by applying a voltage to the gate 302, the device 300 can be controlled to either transmit or block a current, or light, and thus be used as an on-off switch in electric and/or optical systems.

In some embodiments, the conductance is modulated by applying an external field such as an electric or an optical field, as described above, or a magnetic field, or a combination thereof. By way of example, applying an external magnetic field of a few teslas can induce a chance in resistance of the oxide channel 307 by a few percent.

In other embodiments, the conductance of the oxide channel 307 can be modulated by applying heat to induce a change in temperature of the functional oxide material in the oxide channel 307.

In some embodiments, the layer 309 of gate dielectric material is made from an insulator or a ferroelectric oxide. In some embodiments, the source 303 and drain 304 are made of highly doped semiconductors or metals.

Figure 4:
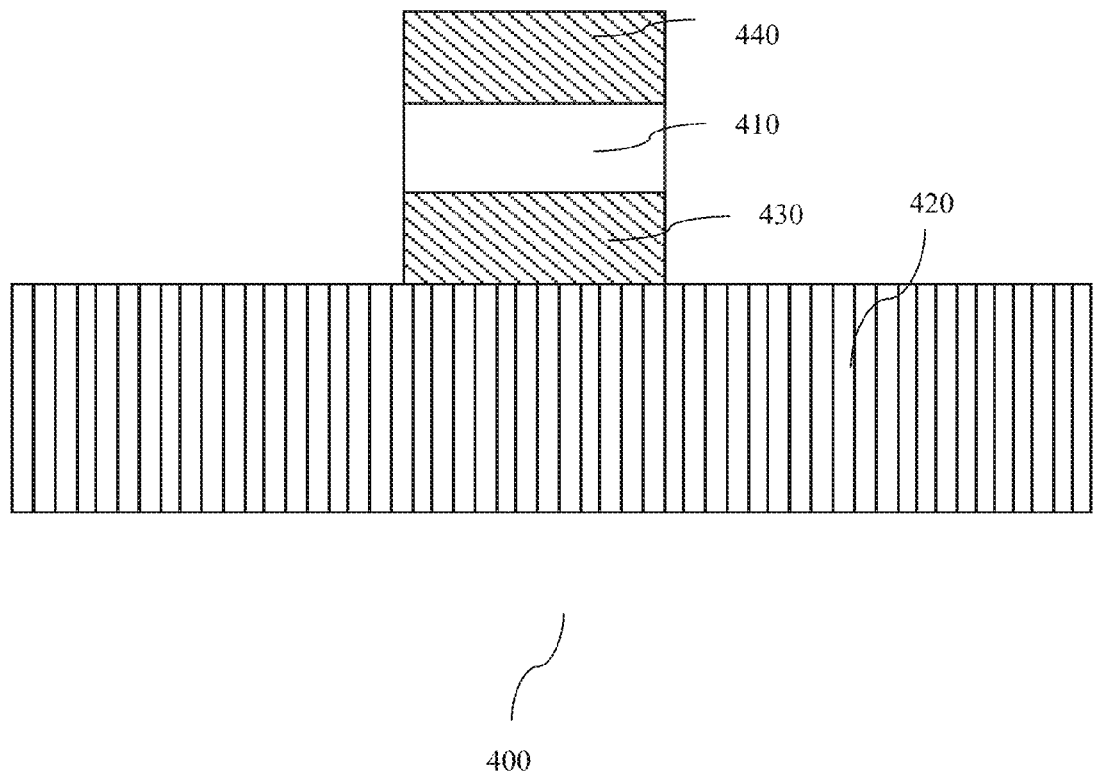
FIG. 4 is a schematic diagram of a memory device in accordance with an embodiment of the present disclosure, including a functional layer with a tunable resistance that can lead to either charge storage or charge discharge.

FIG. 4 is a schematic diagram of a two-terminal device 400 adapted to function as a memory device. In the illustrated embodiment, the device 400 has a geometry in which an incoming current flows perpendicular to the plane of the substrate. The device 400 includes a substrate 420, a first electrode layer 430 formed on the substrate 420, a functional layer 410 deposited on the first electrode layer, and a second electrode layer 440 on the functional layer 410.

In some embodiments of the present disclosure, the resistance of the functional layer 410 can be tuned by an external perturbation, leading to charge storage or discharge. The state of the functional layer 410 can thus be used as a memory bit.

In other embodiments of the present disclosure, the device 400 can be integrated with other elementary devices such as a transistor to control the charge flow into one or more neighboring devices.

The device 400 may thus function as a circuit element which can be controlled to change from being a resistor to a capacitor, by applying external fields (voltage, light, magnetic field, etc.) so that the device 400 switches between conductance states (conducting and non-conducting).

Figure 5:
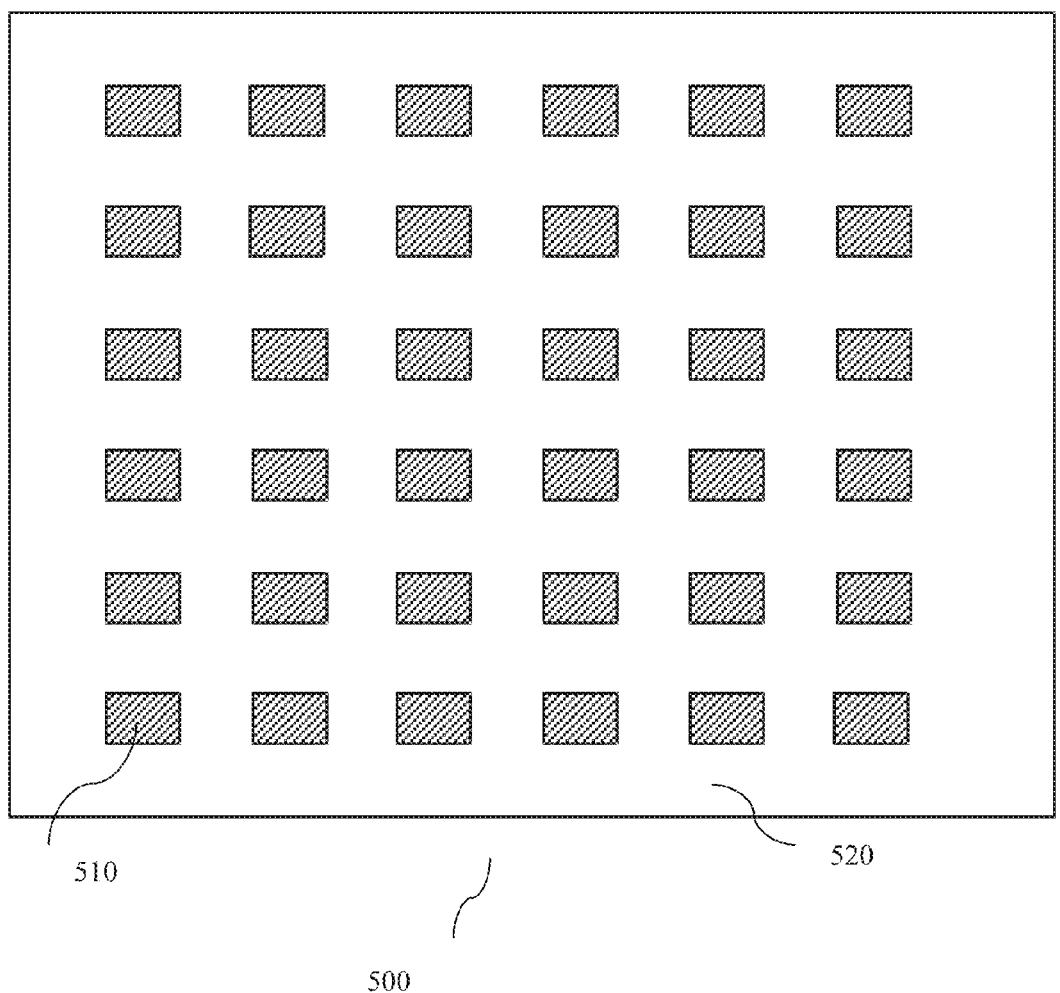
FIG. 5 is a schematic diagram of an array of interconnected devices in accordance with an embodiment of the present disclosure, where each device may be a phase transition switch, or a memory device, or combinations thereof.

FIG. 5 illustrates an array 500 of interconnected devices 510 on a substrate 520. Each one of the devices 510 may be a three terminal device (as disclosed in conjunction with FIG. 3), or a two terminal device (as disclosed in conjunction with FIG. 2 or 4), or a combination thereof. The array 500 may be fabricated using photolithography or electron-beam lithography techniques described above.

In some embodiments, the substrate 520 can be made of an inexpensive material such as polysilicon, plastic, and other low cost, flexible substrates. In these embodiments, since the functional layer is grown on the substrate, the substrate largely acts as a support, obviating the need for very high quality silicon crystals that arises in silicon based devices such as standard transistor chips for carrier transport.

Figure 6:
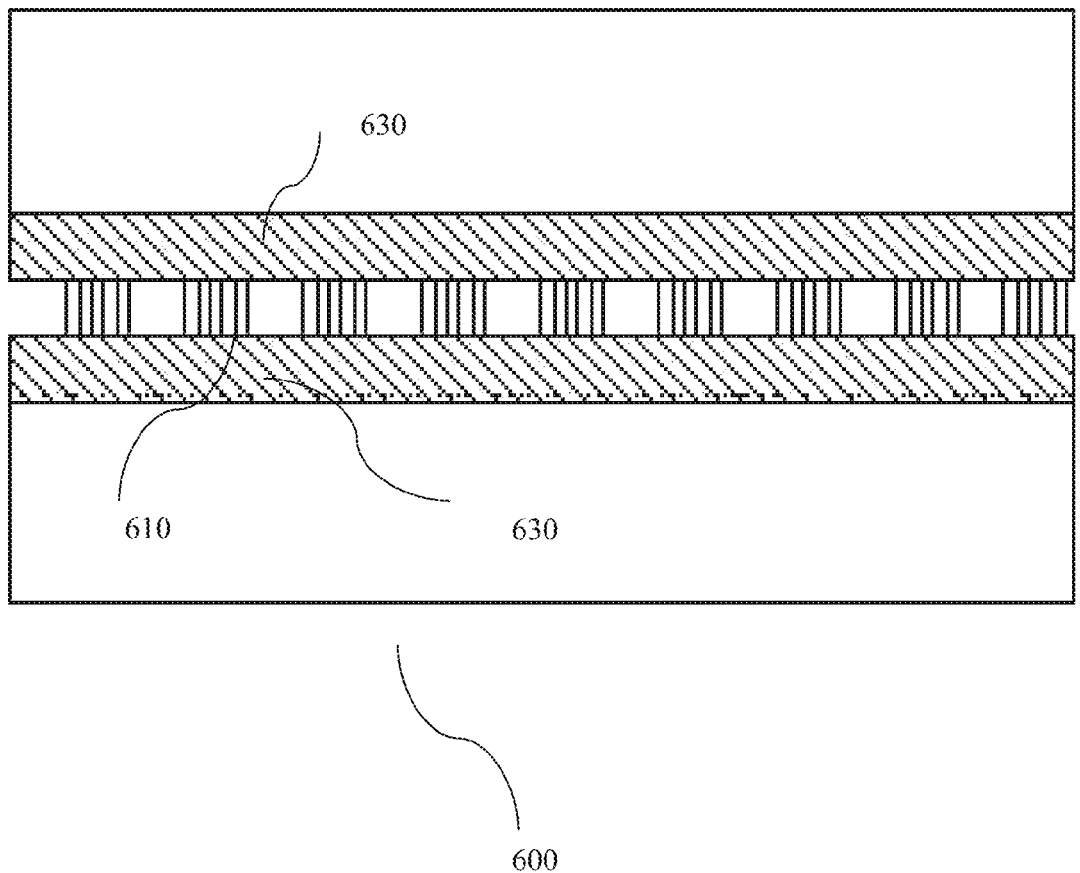
FIG. 6 is a schematic diagram of a plurality of smart connections that undergo phase transitions that result in conductance change, in accordance with an embodiment of the present disclosure.

FIG. 6 illustrates a device 600 that includes a plurality of phase transition based smart connections 610, and chips 630 disposed on either side of the smart connections 610. When a voltage is applied to a smart connection 610, that smart connection 610 can be changed from an insulator to a conductor, and therefore can be made into a reconfigurable switch. The resistance of the individual smart connections 610 can thus be tuned externally, making the device 600 a smart integrated device.

Such conductance transitions can make a variety of three-dimensional devices possible and multi-functionality can be built into the device 600. Heterogeneous integration of multiple devices can be accomplished through bonding with the smart connections 610, which can be made to undergo phase transitions resulting in conductance change.

In the illustrated embodiment, the chips 630 are process chips found in logic, memory, electronic and optic devices. The chips can enable programmable interconnections of a very large density. Depending on the application, the interconnection resistance can be changed and tuned leading to new device functionality with the same device pattern. This can result in savings relating to cost, form factor, and weight.

Figure 7:
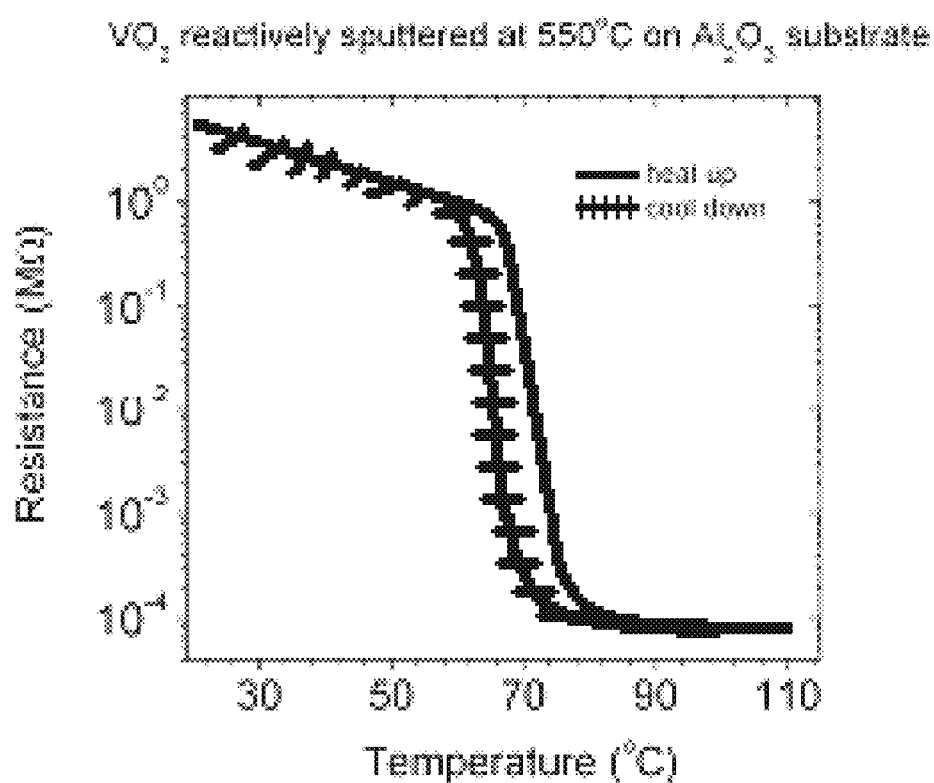
FIG. 7 illustrates a phase transition in vanadium oxide with over four orders of magnitude change in conductance.

FIG. 7 is a plot of a phase transition in vanadium oxide, with over four orders of magnitude change in conductance at a temperature of about 71 degrees Celsius. Detailed resistance versus temperature plots are shown in C. Ko and S. Ramanathan, Journal of Applied Physics, 103, 106104 (2008). This reference is herein incorporated by reference in its entirety for all that it teaches without exclusion of any part thereof.

In some embodiments, one or more of the devices described above in conjunction with FIGS. 1-6 may use thin films of vanadium oxide (having very sharp phase transition properties) as their functional (or smart) layers.

Figure 8:
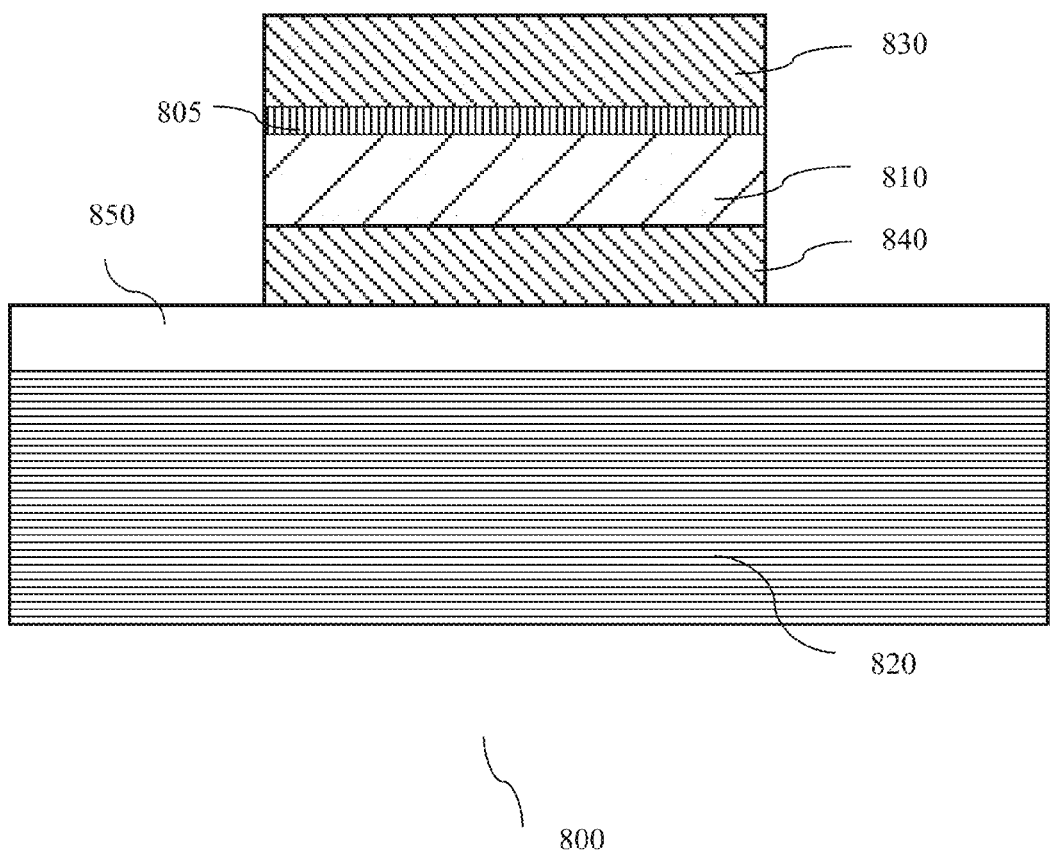
FIG. 8 is a schematic diagram of a capacitive device that includes a smart layer having a resistance that can be modulated to tune the leakage current across the capacitive device.

FIG. 8 is a schematic diagram of a capacitive device 800 that may be integrated into a solid state device or circuit. The capacitive device 800 includes a functional layer (or smart layer) 810 made of smart material, disposed between a top electrode layer 830 and a bottom electrode layer (or seed layer) 840. A thin oxide dielectric layer 805 is disposed between the top electrode 830 and the functional layer 810. The bottom electrode layer 840 is formed on a layer 850 which may be conducting or insulating. The conducting or insulating layer, in turn, is formed on a substrate 820.

In this embodiment, the functional layer (or smart layer) 810 is composed of a smart material that can undergo a change in electrical resistance upon one or more external stimuli. The device 800 can thus be used as a capacitive element in a solid state or other device. The capacitance of the device 800 can be changed because the functional layer can become a metal or an insulator, depending upon the conductance modulation induced by the external stimuli. Thus, by changing the nature of conduction of the smart layer 810, the capacitance of the device 800 can be changed. When the functional layer 810 is an insulator, it adds to the capacitance of 800; when the functional layer 810 becomes conducting, only the thin oxide dielectric layer 805 contributes to the capacitance of 800. The leakage current across the capacitor device 800 can thus be tuned by the resistance of the smart layer 810.

In one embodiment, the device 800 is a metal-oxide-semiconductor capacitor device that is fabricated with a phase transition switch.

As described earlier, the external stimuli include one or more of: temperature, electric field, magnetic field and/or optical field. An example of an optical field based external stimulus is photon irradiation close to or exceeding the band gap of the oxide that can inject charge carriers into the conduction band leading, to electrical resistance change. Alternate or coupled excitations are electric stimuli that can lead to accumulation of charge carriers, and in turn to conductance transition.

FIG. 8 schematically illustrates only one of many possible structures for such a capacitive element. The capacitance and resistance of the device 800 can be controlled by manipulating the functionality of the smart layer 810. The functionality can relate to conductance, magnetoresistance, dielectric constant and similar electronic and magnetic properties.

Figure 9:
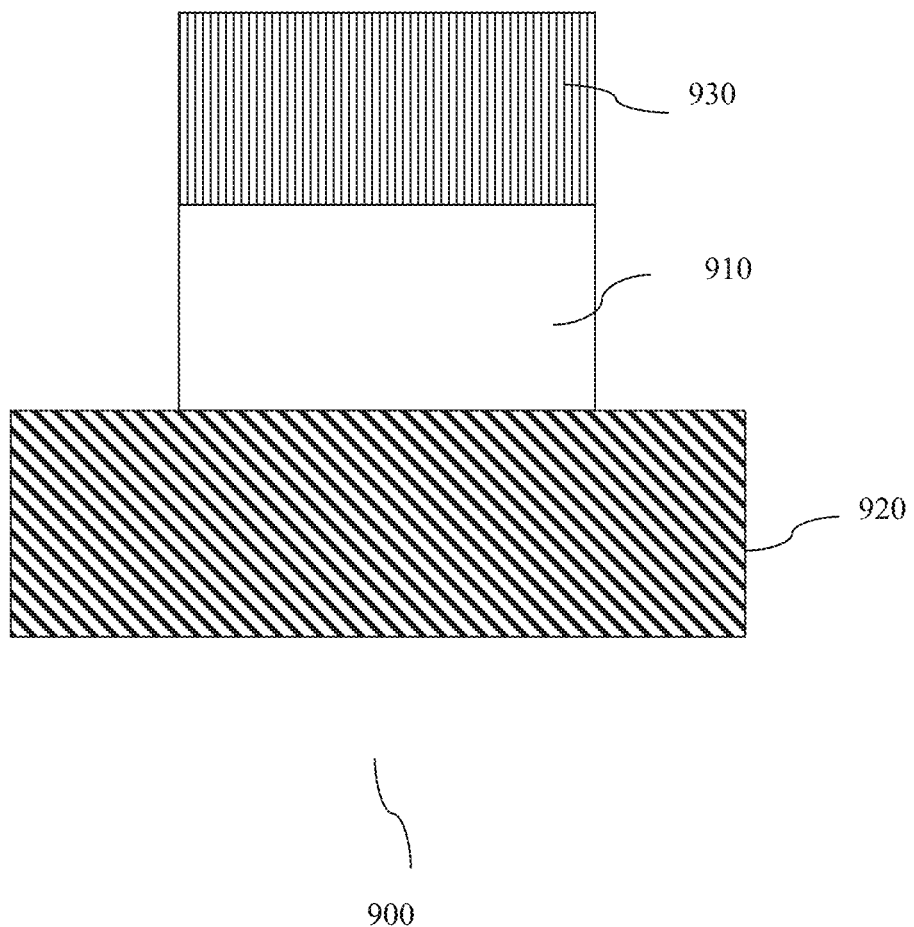
FIG. 9 is a schematic diagram of a capacitive device in which a functional layer is directly synthesized on a substrate.

FIG. 9 is a schematic diagram of a capacitor device 900 in which a functional layer 910 is directly synthesized on a substrate 920, and a top electrode layer 930 is deposited on the functional layer 910. In this embodiment, external stimuli can be applied through the top electrode layer 930 on top of the functional layer 910.

As described above, the capacitive devices 800 and 900 can be used to store charge during the non-conducting state of the functional layer (810 and 910), and to transmit electricity during the conducting state of the functional layer. These devices can be used in circuits to control current flow across various devices. A controller (not shown) can be configured to control current flow across the device by controlling the transition of the functional material between the conducting state and the non-conducting state.

In some embodiments, the smart layers 810 and 910 are made of a functional oxide, including but not limited to: vanadium oxide, titanium oxide and/or doped multi-component oxides of vanadium, chromium, bismuth, titanium, and titanates.

In some embodiments, the thin oxide dielectric layer 805 is made of $SiO_2$, $Al_2O_3$, $HfO_2$, $ZrO_2$, or any other insulating material, including non-oxide insulating materials such as silicon nitride thin films. The thickness of the thin oxide dielectric layer ranges from a few nanometers to several hundred nanometers. The thickness affects the strength of the electric field, and therefore in some embodiments is optimized depending on the functional layers. In some embodiments, a combination of external fields induces the conductance transition.

In some embodiments, the electrodes in the capacitive devices 800 and 900 are made of metal or highly doped semiconductors. In other embodiments, the electrodes are ferromagnetic and/or ferroelectric. In some embodiments, one of the electrodes is the substrate.

The smart capacitor devices 800 and 900 described in conjunction with FIGS. 8 and 9 can be interconnected with other capacitors, logic elements, memory devices and/or other devices that can control current flow or perform computing operations or store information. Examples include connecting the capacitor devices 800 and 900 to a memory device and using the state of the functional layer as a switch to control current flow into the memory device. Similarly, the capacitor devices 800 and 900 can be used to control current flow into a transistor or into one or more circuits consisting of transistors, capacitors and inductors. The switch state can be encoded as 0 or 1 leading to computing operations that can be performed utilizing this device or set of devices.

In the embodiments described in conjunction with FIGS. 1-9 above, the functional (or smart) layers, as well as the insulating or dielectric layers, can be deposited or grown using thin film deposition techniques. These techniques include, but are not limited to: atomic layer deposition, chemical vapor deposition, and physical vapor deposition such as sputtering, evaporation and molecular beam synthesis. These methods are described in references that include textbooks, journal articles, and other publications. One example of such a reference is "Microchip Fabrication—A Practical Guide to Semiconductor Processing," (2004) by Peter Van Zandt. This reference is hereby incorporated by reference in its entirety.

A number of lithography techniques are commonly used for micro fabrication of semiconductors and other devices, such as integrated circuits and micro-electromechanical systems. Lithographic processes typically involve selectively removing parts of a thin film, or the bulk of a substrate. In photolithography, optical methods are used to transfer the pattern from a photo mask to a light-sensitive chemical such as photo resist on the substrate. The pattern is then imprinted onto the material underneath through a series of chemical treatments.

In the case of ultra-small device sizes, for example below about few hundred nanometers, electron-beam lithography may be used. In electron beam lithography, a beam of electrons is scanned in a patterned fashion across a surface covered with a film of resist. The exposed or non-exposed regions of the resist are then selectively removed.

Lithography is described in many textbooks and publications, one example of which is "Lithography, Introduction to Microelectronic Fabrication," (by Jaeger, Richard C., 2002), which is incorporated herein by reference in its entirety.

Methods and systems for synthesizing thin films of vanadium oxide (and/or vanadium dioxide) are disclosed in Exhibits A and B of copending U.S. Provisional Patent Application No. 61/085,656 (the '656 provisional application), which is incorporated herein by reference in its entirety for all that it teaches without exclusion of any part thereof.

In one or more embodiments of the present disclosure, the methods and systems disclosed in the '656 provisional application, including but not limited to Exhibits A and B thereto, may be used to synthesize thin films of vanadium oxide (and/or vanadium dioxide), for the functional layers used in phase transition devices or capacitive devices described above.

In some embodiments, a method of controlling flow of a current through a system includes connecting a phase transition device to the system, where the phase transition device includes a layer of a functional material deposited on a substrate. The method further includes applying one or more external stimuli onto the layer of functional material in the phase transition device, so as to cause the functional material to undergo a conductance transition between a non-conducting state in which the functional material transmits electricity and allows the current to flow through the system, and a non-conducting state in which the functional material does not transmit electricity and blocks the flow of the current through the system.

In some embodiments, a method of fabricating a device includes depositing a layer of a material onto a substrate. The material is adapted to undergo a conductance transition between a conducting state and a non-conducting state, upon application of an external stimulus to the material.

The act of depositing the layer of the material onto the substrate includes performing one or more of the following thin film deposition techniques: performing an atomic layer deposition; performing a chemical vapor deposition, and performing a physical vapor deposition. Physical vapor deposition includes without limitation sputtering; evaporation; and molecular beam synthesis. Other thin film deposition methods and systems may also be used.

In sum, a number of devices have been described that utilize smart material that can undergo ultra-fast phase transitions in response to external stimuli.

Many other related embodiments are possible. As one of many possible examples, the above-described phase transition devices and/or smart capacitor devices may be integrated onto CMOS platforms, high mobility semiconductors, and electronic devices and sensors. As described above, flexible substrates may be used in addition to or in lieu or semiconductor substrates, since the functionality of the device is made possible by a deposited layer (such as an oxide undergoing a phase transition). In some embodiments, therefore, the functional layers may be grown on flexible substrates such as plastics, polyamides, polycrystalline silicon. Inexpensive substrates may be used since the functionality does not depend on quality of the substrate. In these embodiments, this feature allows for low cost electronics, since a large part of the cost in silicon based transistors and memory technologies is caused by high quality single crystalline silicon that is needed to fabricate the transistors.

The components, steps, features, objects, benefits and advantages that have been discussed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages. The components and steps may also be arranged and ordered differently.

Nothing that has been stated or illustrated is intended to cause a dedication of any component, step, feature, object, benefit, advantage, or equivalent to the public. While the specification describes particular embodiments of the present disclosure, those of ordinary skill can devise variations of the present disclosure without departing from the inventive concepts disclosed in the disclosure.

While certain embodiments have been described of systems and methods relating to phase transition devices and smart capacitor devices, it is to be understood that the concepts implicit in these embodiments may be used in other embodiments as well. In the present disclosure, reference to an element in the singular is not intended to mean "one and only one" unless specifically so stated, but rather "one or more." All structural and functional equivalents to the elements of the various embodiments described throughout this disclosure, known or later come to be known to those of ordinary skill in the art, are expressly incorporated herein by reference.

What is claimed is:

1. A method comprising:
fabricating a bottom electrode on a substrate;
depositing a layer of a functional oxide between the bottom electrode and a top electrode;
depositing a thin oxide dielectric layer between the top electrode and the functional oxide layer so as to generate a smart capacitive device; and
performing post-deposition UV treatment of the functional oxide at a temperature less than 250° C. so as to enhance oxygen incorporation in the functional oxide.

2. The method of claim 1, further comprising applying an external stimulus onto the layer of functional oxide so as to cause the functional oxide to undergo a conductance transition between a conducting state during which the functional oxide transmits electricity and a nonconducting state during which the functional oxide blocks electricity causing the capacitive device to store charge, thereby modulating the capacitance of the smart capacitive device.

3. The method of claim 2, wherein the external stimulus comprises one of: an electric field; a magnetic field; an optical field; and heat.

4. The method of claim 1, wherein the thin oxide dielectric layer is made of an insulating material.

5. The method of claim 4, wherein the insulating material comprises at least one of: $SiO_2$; $Al_2O_3$; $HfO_2$; $ZrO_2$; and silicon nitride.

6. A method comprising:
disposing a source and a drain onto a substrate;
forming an oxide channel on the substrate between the source and the drain, wherein the oxide channel is made of a functional oxide;
performing low temperature deposition of a layer of gate dielectric material onto the oxide channel at a temperature less than 300° C.;
depositing a gate onto the layer of low temperature deposited gate dielectric material so as to generate a phase transition device; and
performing post-deposition UV treatment of the oxide channel by applying UV light to the oxide channel at a temperature less than 250° C. so as to enhance oxygen incorporation in the oxide channel.

7. The method of claim 1, wherein the functional oxide comprises at least one of: a vanadium oxide; a titanium oxide; a doped oxide; and a titanate.

8. The method of claim 1, wherein the substrate is made of at least one of: a semiconductor material; and a flexible material.

9. The method of claim 8, wherein the semiconductor material comprises at least one of: Si, $SiO_2$, $AlO_3$, AlN, MgO, ZnO, Ge, InAs, pentacene, and anthracene; and wherein the flexible material comprises at least one of: polysilicon; plastic; polymide; and polymer.

10. The method of claim 1, further comprising, the acts of:
interconnecting the smart capacitive device with a second device; and
controlling current flow through the second device by modulating the conductance of the functional oxide.

11. The method of claim 1, wherein the act of depositing the layer of functional oxide onto the substrate includes performing at least one of:
atomic layer deposition; chemical vapor deposition, and physical vapor deposition.

12. The method of claim 11, wherein the act of performing physical vapor deposition includes performing at least one of sputtering; evaporation; and molecular beam synthesis.

13. The method of claim 1, wherein the bottom electrode and the top electrode are made of at least one of: a metal; and a doped semiconductor.

14. The method of claim 6, further comprising applying an external field onto the gate so as to change conductance of the functional oxide.

15. The method of claim 14, wherein the external field comprises at least one of: an electric field; a magnetic field; an optical field; and heat.

16. The method of claim 6, wherein the layer of gate dielectric material is made of at least one of: an insulator; and a ferroelectric oxide.

17. The method of claim 6, wherein the source and the drain are made of at least one of: a doped semiconductor; and a metal.

18. The method of claim 6, further comprising, the act of interconnecting a plurality of the phase transition devices into an array of interconnected devices.

19. The method of claim 18, further comprising disposing chips on either side of the phase transition devices, thus allowing programmable interconnections.

* * * * *